United States Patent [19]
Wu

[11] Patent Number: 6,075,309
[45] Date of Patent: Jun. 13, 2000

[54] BROADBAND PIEZOELECTRIC SHUNTS FOR STRUCTURAL VIBRATION CONTROL

[75] Inventor: Shu-Yau Wu, Artesia, Calif.

[73] Assignee: McDonnell Douglas Corporation, Seal Beach, Calif.

[21] Appl. No.: 09/041,314

[22] Filed: Mar. 12, 1998

[51] Int. Cl.[7] .................................................. H01L 41/04
[52] U.S. Cl. .......................................................... 310/319
[58] Field of Search ..................................... 310/314, 316, 310/317, 319, 311

[56] References Cited

U.S. PATENT DOCUMENTS

| | | | |
|---|---|---|---|
| 4,156,823 | 5/1979 | Suzuki | 310/319 X |
| 4,158,787 | 6/1979 | Forward | 310/319 X |
| 4,471,257 | 9/1984 | Kleinschmidt | 310/319 X |
| 5,032,753 | 7/1991 | Yamaguchi et al. | 310/319 X |

FOREIGN PATENT DOCUMENTS

WO 85/05499  12/1985  WIPO ..................................... 310/319

*Primary Examiner*—Mark O. Budd
*Attorney, Agent, or Firm*—Stout, Uxa, Buyan & Mullins, LLP; Donald E. Stout

[57] ABSTRACT

A negative capacitance converter is used in combination with a buffer circuit to form an electrical shunt circuit. The negative capacitance converter and the buffer circuit, together, minimize or eliminate oscillations of a negative impedance generated by the electrical shunt circuit. Additionally, a specific configuration of the negative capacitance converter is used to provide optimum stability. The buffer circuit includes a Riordan-type circuit, with the negative capacitance converter being substituted for one of the impedance elements of the Riordan-type circuit. Resistors are used to replace the other impedance elements of the Riordan-type circuit. An additional capacitor is placed across one of the operational amplifiers of the Riordan-type circuit, in order to provide additional stability.

29 Claims, 3 Drawing Sheets

BROADBAND PIEZOELECTRIC SHUNTS FOR STRUCTURAL VIBRATION CONTROL

BACKGROUND OF THE INVENTION

1. Field of the Invention

The present invention relates generally to structural damping and vibration control devices and, more particularly, to passive piezoelectric shunt circuits.

2. Description of Related Art

Negative impedance converters have been used in the prior art for reducing or neutralizing an impedance of an electrical circuit. One particular type of negative impedance converter is a negative capacitance converter. A negative capacitance converter generally comprises an operational amplifier having a first resistor connected between the positive input terminal of the operational amplifier and the output terminal of the operational amplifier, and a second resistor connected between the negative terminal of the operational amplifier and the output terminal of the operational amplifier. A capacitor is connected between the negative terminal of the operational amplifier and ground. The impedance of the capacitor is equal the $1/j\omega C$. The input impedance of the negative impedance converter, measured between the positive terminal and the negative terminal of the operational amplifier, is equal to the negative of the impedance of the capacitor if the two resistors are made equal in value. Other configurations of negative capacitance converters can be generated by rearranging the two resistors and the capacitor.

Negative capacitance converters can be used in accordance with the prior art for providing passive piezoelectric shunting. Passive piezoelectric shunting is generally achieved by bonding on or imbedding in a structure a piezoelectric material, such as one or more thin patches of lead-zirconate-titanate (PZT). The structure will typically be subjected to vibration during normal use, and the thin patches of PZT material are implanted in the structure in order to provide structural damping and vibration control for the structure. As a result of the piezoelectric nature of the PZT material, approximately 60 to 70 percent of the mechanical energy of the vibrating structure can be converted to electrical energy. The electrical energy induced in the PZT material must be forced to flow as an electric current through an electrical shunting circuit. The electrical shunting circuit, including a negative capacitance converter and a resistor placed in parallel with the negative capacitance converter, is electrically connected to the PZT terminals in order to extract electrical energy from the PZT material, as the structure and the PZT material vibrate. The electrical energy is extracted and is dissipated in the resistor by Joul heating.

Since the impedance of the PZT material is generally capacitive with a capacitance value equal to C, a negative capacitance converter circuit having a capacitance value of negative C over the broad frequency band can be used to make the shunt circuit anti-resonant, i.e. cancel the reactive impedance, over the broad frequency band by connecting the negative capacitance in parallel with the PZT. This leaves only the resistive impedance or resistance in the shunt circuit. Negative impedance converters can provide a reasonable negative impedance for canceling the impedance of the PZT material, but the negative impedance converter of the prior art is not altogether effective. Negative impedance converters, when used with shunt circuits for canceling the impedance of a PZT material, often oscillate and, accordingly, cannot effectively cancel the impedance of the PZT material. A negative impedance converter can oscillate because the capacitance of the PZT material can change with frequency and temperature. The capacitance of the PZT material, in general, goes down with frequency. Any change in the capacitance of the PZT material will require a change in the value of the capacitor of the negative impedance converter, but the prior art negative impedance converters do not have means to reconfigure and stabilize the shunt circuit.

SUMMARY OF THE INVENTION

The negative impedance converters of the present invention are used in combination with either buffer circuits or other circuit components to form stable broadband shunt circuits. A first embodiment of the present invention comprises a buffer circuit connected between a PZT terminal and a negative impedance (capacitance) converter circuit. The buffer circuit comprises a Riordan-type circuit, with the negative impedance (capacitance) converter circuit substituting for the impedance element between the negative input terminal of the first stage operational amplifier (of the Riordan-type circuit) and ground. A resulting shunt circuit formed by the buffer circuit and the negative capacitance converter circuit minimizes or eliminates oscillations and improves circuit stability. An additional stability compensation capacitor may be placed between the negative input terminal and the output terminal of the first stage operational amplifier (of the Riordan-type circuit) in order to provide additional circuit stability. A second embodiment of the present invention can comprise either a capacitor branch circuit connected in parallel with a resistor of the negative impedance (capacitance) converter, the resistor and capacitor being connected in parallel between the negative input terminal and the output terminal of the operational amplifier of the negative impedance (capacitance) converter circuit, or a series resistor and capacitor branch circuit connected between the negative input terminal and ground. Alternatively, the first embodiment can comprise both branch circuits together.

The present invention, together with additional features and advantages thereof, may best be understood by reference to the following description taken in connection with the accompanying illustrative drawings.

DETAILED DESCRIPTION OF THE PRESENTLY PREFERRED EMBODIMENTS

Figure 1:
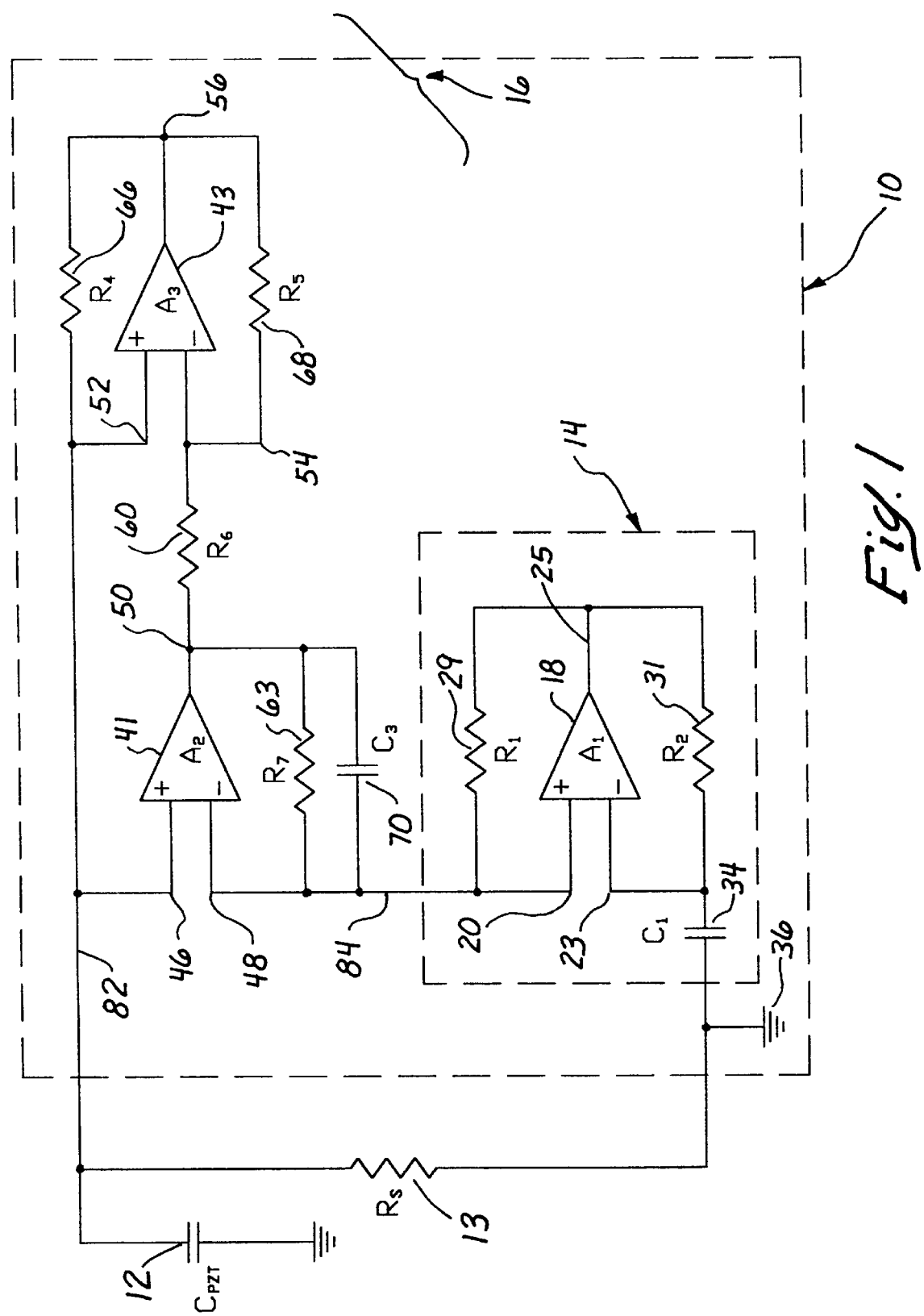
FIG. 1 illustrates a broadband piezoelectric shunt circuit, according to a first presently preferred embodiment.

Referring more particularly to the drawings, a broadband piezoelectric shunt circuit 10 is illustrated in FIG. 1 coupled to an input load 12. The input load 12 preferably comprises a piezoelectric material, such as a thin patch of lead-zirconate-titanate. The broadband piezoelectric shunt circuit 10 comprises a negative impedance converter circuit 14, which is coupled to a Riordan-type circuit 16.

The negative impedance converter circuit 14 comprises an operational amplifier 18 having a positive terminal 20, a negative terminal 23, and an output terminal 25. A first resistor 29 is connected between the positive terminal 20 and the output terminal 25, and a second resistor 31 is connected between the negative terminal 23 and the output terminal 25. An impedance element 34 is connected between the negative terminal 23 and the ground 36. The impedance element 34 preferably comprises a capacitor, which is selected to have a capacitance equal to the capacitance of the input load 12. In alternative embodiments wherein the input load 12 comprises an inductance, for example, the impedance element 34 would comprise an inductor. A shunt resistor 13 is coupled between the input load 12 and the ground 36.

The Riordan-type circuit 16 comprises a first operational amplifier 41 and a second operational amplifier 43. The first operational amplifier 41 comprises a positive terminal 46, a negative terminal 48, and an output terminal 50; and the second operational amplifier 43 comprises a positive terminal 52, a negative terminal 54, and an output terminal 56. A first resistive element 60 is connected between the output terminal 50 of the first operational amplifier 41 and the negative terminal 54 of the second operational amplifier 43. A second resistive element 63 is connected between the negative terminal 48 of the first operational amplifier 41 and the output terminal 50 of the first operational amplifier 41. A third resistive element 66 is connected between the positive terminal 52 of the second operational amplifier 43 and the output terminal 56 of the second operational amplifier 43, and a fourth resistive element 68 is connected between the negative terminal 54 of the second operational amplifier 43 and the output terminal 56 of the second operational amplifier 43.

In the presently preferred embodiment, a capacitor 70 is connected across the second resistive element 63. The capacitor 70 is preferably used to remove high-frequency oscillations of the broadband piezoelectric shunt circuit 10. When the capacitance of the input load is less than the capacitance of the negative impedance (capacitance) converter, the broadband piezoelectric shunt circuit 10 may oscillate. Oscillation generated by the broadband piezoelectric shunt circuit 10 can impede the shunting function of the broadband piezoelectric shunt circuit 10, since the net parallel impedance of the negative impedance generated by the broadband piezoelectric shunt circuit 10 and the input load 12 will become negative. The capacitor 70, when placed in parallel with the second resistive element 63, effectively reduces or eliminates the oscillation of the broadband piezoelectric circuit 10. The capacitor 70, however, is not required for operation of the present invention. In an alternative embodiment, the capacitor 70 is not placed across the second resistive element 63 and, instead, a capacitor (not shown) is placed across the second resistor 31 of the negative impedance converter circuit 14. As another alternative, the capacitor 70 is not placed across the second resistive element 63 and, instead, a resistor is placed in series with the impedance element 34 of the negative impedance converter circuit 14.

The Riordan-type circuit comprises a first input terminal 82 and a second input terminal 84. The first input terminal 82 is connected to the input load 12, and the second input terminal 84 is connected to the negative impedance converter circuit 14. If one represents the impedance of the negative impedance converter circuit 14 as $Z_1$, then the impedance of the broadband piezoelectric shunt circuit 10 can be defined as the product of the first resistive element 60, the third resistive element 66, and $Z_1$, divided by the product of the second resistive element 63 and the fourth resistive element 68. In accordance with the present invention, the product of the first resistive element 60 and the third resistive element 66 is set to equal the product of the second resistive element 63 and the fourth resistive element 68. The value of any one of the first resistive element 60, the second resistive element 63, the third resistive element 66, and the fourth resistive element 68 can be adjusted to achieve the desired relationship between the four resistors 60, 63, 66, and 68. If one selects 66 and 68 to be equal, one can use the ratio of 60 and 63 to fine-tune the input impedance of the Riordan-type circuit during the broadband shunting operation. This allows one to cancel the PZT capacitance 12 with the input capacitance of the Riordan-type circuit and to make the parallel reactance of the shunt circuit very large or near antiresonance. One can also use other values of the resistors and capacitors to produce a large reactive impedance or reactance.

In the presently preferred embodiment, the first resistive element 60 comprises a variable resistor, which can be adjusted to fine-tune the relationship between the four resistors 60, 63, 66, and 68. Any one or more of the four resistors 60, 63, 66, 68, can be provided as a variable resistor, in order to facilitate the matching of the product of the first resistive element 60 and the third resistive element 66 to the product of the second resistive element 63 and the fourth resistive element 68.

When the four resistors 60, 63, 66, and 68 are set in accordance with the present invention as described above, the impedance of the broadband piezoelectric shunt circuit 10 is equal to the impedance $Z_1$ of the negative impedance converter circuit 14. The impedance of the negative impedance converter circuit 14 is equal to the negative value of the impedance element 34 when the two resistors $R_1$ and $R_2$ are made equal in value. Accordingly, the impedance of the broadband piezoelectric shunt circuit 10 is equal to the negative value of the impedance of the impedance element 34. In the presently preferred embodiment, the impedance element 34 has an impedance of $1/j\omega C$ and the impedance of the broadband piezoelectric shunt circuit 10 is equal to $-1/j\omega C$, where C is the capacitance of the impedance element 34. Although the impedance element 34 preferably comprises a capacitor, other elements, such as an inductor, for example, may alternatively be used for other applications. In accordance with the present invention, if the capacitance (or inductance) of the impedance element 34 does not exactly match the capacitance (or inductance) of the input load 12, then the resistance of the variable first resistive element 60 can be changed until the negative impedance of the braodband piezoelectric shunt circuit 10 exactly cancels the impedance of the input load 12. Accordingly, the impedance of the braodband piezoelectric shunt circuit 10 can be conveniently adjusted or tuned to cancel out the capacitance (or inductance) of the input load 12, by adjusting the resistance of the variable first resistive element 60.

In the presently preferred embodiment, the value of the first resistor 29 of the negative impedance converter circuit 14 equals the value of the second resistor 31 of the negative impedance convert circuit 14. In an alternative embodiment, the value of the first resistor 29 is not equal to the value of the second resistor 31 and, accordingly, the value of the impedance between the second input terminal 84 and the ground 36 is not equal to the negative value of the impedance element 34. In this alternative embodiment, however, the variable first resistive element 60 can be changed to ensure that the impedance of the broadband piezoelectric shunt circuit 10 cancels out the capacitance (or inductance) of the input load.

Figure 2A:
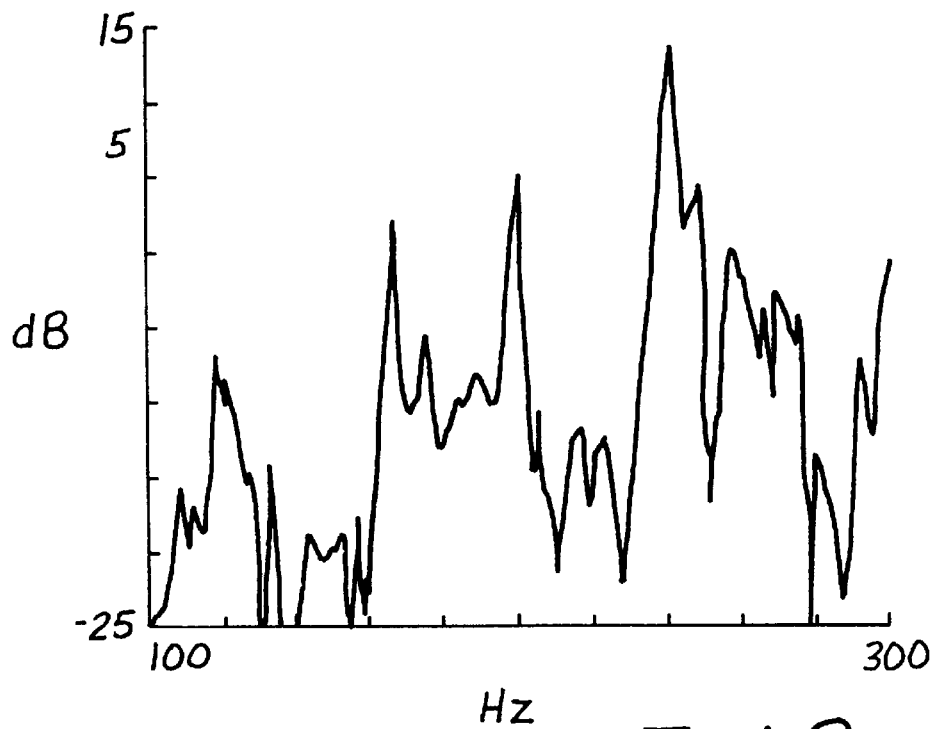
FIG. 2a illustrates a frequency response curve of a composite faring without the broadband piezoelectric shunt circuit of the present invention.
Figure 2B:
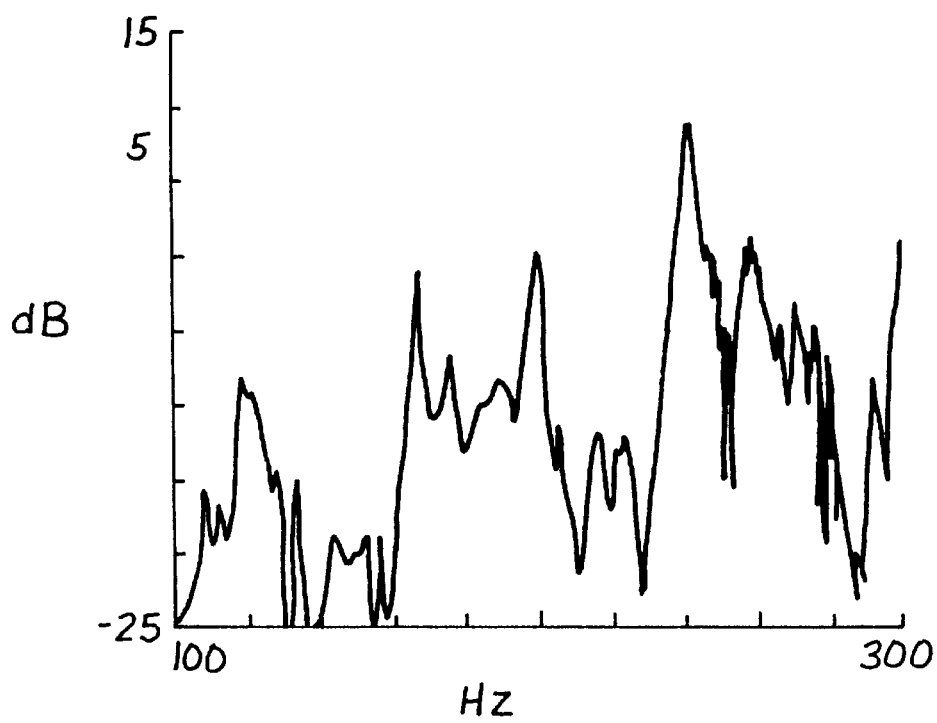
FIG. 2b illustrates a frequency response curve of a composite faring using the broadband piezoelectric shunt circuit of the presently preferred embodiment.

FIG. 2a illustrates a frequency response curve of a composite faring without the broadband piezoelectric shunt circuit of the present invention. FIG. 2b illustrates a frequency response curve of a composite faring using the broadband piezoelectric shunt circuit of the presently preferred embodiment. In the plot of FIG. 2b, the composite faring was bonded with a PZT patch, and the PZT patch was shunted with the broadband piezoelectric shunt circuit 10 of FIG. 1. In the plot of FIG. 2b, the high resonant peaks over the frequency range from 100 Hz to 300 Hz are reduced 5 to 7 decibels, relative to the peaks of the FIG. 2a plot, using the broadband piezoelectric shunt circuit 10 of the present invention. A shunt resistance 13 (FIG. 1) of 300KΩ was used in the test demonstration.

The performance requirements of future advanced space systems have motivated developments of new structural designs. One approach is the use of adaptive structures with the incorporation of "smart" materials. These adaptive structures may contain different types of sensors and actuators, both made from the smart materials, signal conditioning circuits, and microprocessors for active and passive controls. The present invention discloses an advanced technique which can be used for damping structural vibration modes over a broad frequency band. The shunt circuit of the present invention is relatively simple in design and is effective for providing passive control of structural vibration and acoustic noise suppression.

Figure 3:
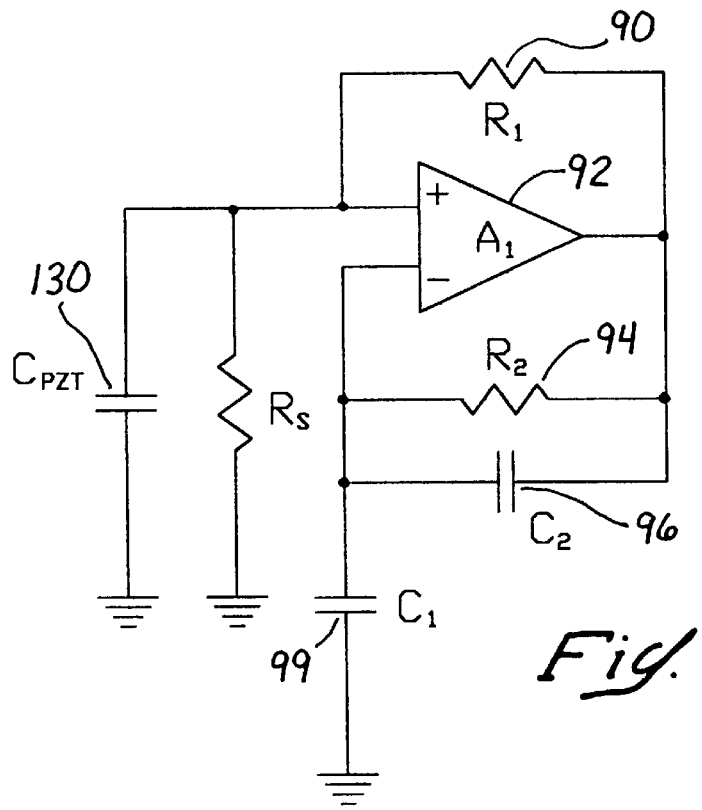
FIG. 3 illustrates a broadband piezoelectric shunt circuit, according to a second presently preferred embodiment.
Figure 4:
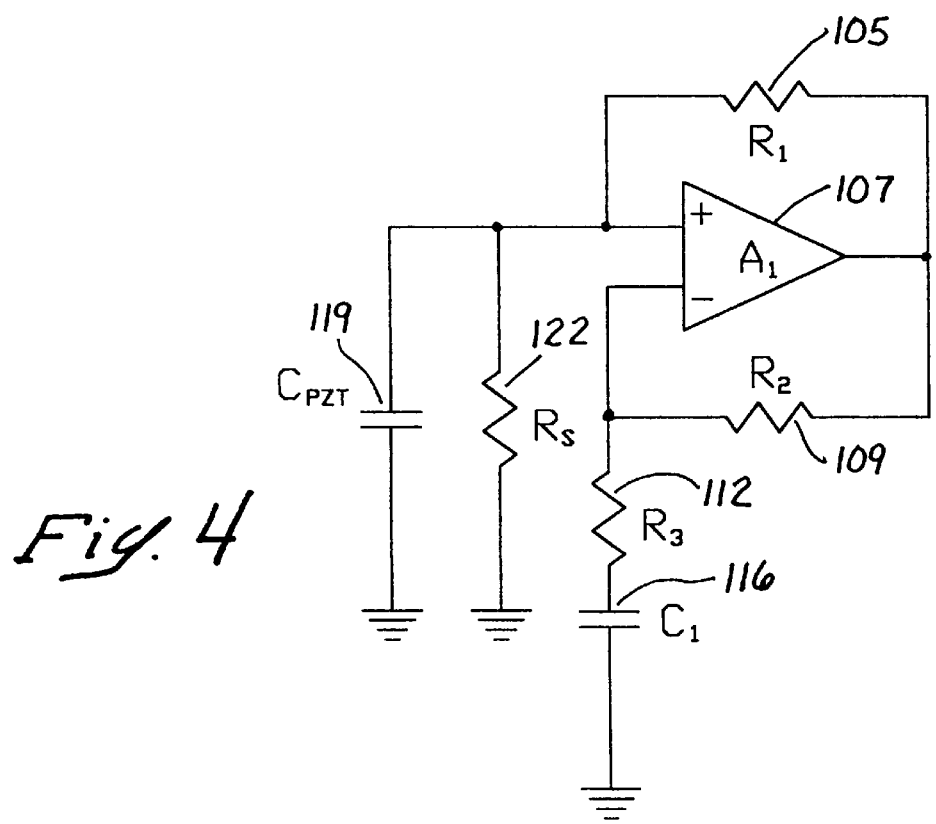
FIG. 4 illustrates a broadband piezoelectric shunt circuit, according to a third presently preferred embodiment.

FIG. 3 illustrates a shunt circuit of another preferred embodiment, comprising a resistor 90 connected between a positive input terminal and the output terminal of an operational amplifier 92, a parallel circuit of a resistor 94 and a capacitor 96 connected between a negative input terminal and the output terminal of the operational amplifier 92, and a capacitor 99 connected between the negative input terminal of the operational amplifier 92 and the ground. A shunt circuit in accordance with another preferred embodiment of the present invention is shown in FIG. 4, comprising a resistor 105 connected between a positive input terminal and the output terminal of an operational amplifier 107, a resistor 109 connected between a negative input terminal and the output terminal of the operational amplifier 107, and a series circuit of a resistor 112 and a capacitor 116 connected between the negative input terminal of the operational amplifier 107 and the ground. A PZT capacitor 119 and a shunt resistor 122 are connected between the input and the ground.

In the configuration of the broadband shunt circuit shown in FIG. 3, the values of the resistors 90 and 94, and of the capacitor 99, can be selected according to the capacitance value of the PZT 130. Since the input capacitance of the negative capacitance converter circuit is equal to a negative value of the product of the value of the capacitor 99 and the value of the resistor 94, divided by the value of the resistor 90, one can select a value of the capacitor 99 to be equal to or closer to the capacitance of the PZT 130 if the value of the resistor 90 is equal to the value of the resistor 94. The capacitor 96, which comprises a capacitance that is generally relatively small, is preferably used as the stability compensation capacitor. Similarly, in the embodiment illustrated in FIG. 4, the values of the resistors 105 and 109, and of the capacitor 116, can be selected according to the capacitance value of the PZT 119. The resistor 112 is preferably used as the stability compensation resistor.

Although an exemplary embodiment of the invention has been shown and described, many other changes, modifications and substitutions, in addition to those set forth in the above paragraphs, may be made by one having ordinary skill in the art without necessarily departing from the spirit and scope of this invention.

What is claimed is:

1. A shunt circuit, comprising:
   a Riordan-type buffer circuit having a first input terminal and a second input terminal, the first input terminal being adapted to be coupled to an input load; and
   a negative impedance converter circuit having a first connection terminal and a second connection terminal, the first connection terminal being coupled to the second input terminal and the second connection terminal being coupled to a ground.

2. The shunt circuit as recited in claim 1, wherein the input load comprises a piezoelectric element.

3. The shunt circuit as recited in claim 1, wherein the Riordan-type circuit comprises a variable resistance element.

4. The shunt circuit as recited in claim 1, wherein the negative impedance converter circuit comprises an operational amplifier having a first terminal, a second terminal and an output terminal, a first resistor connected between the first terminal and the output terminal, a second resistor connected between the second terminal and the output terminal, and an impedance element connected to the second resistor.

5. The shunt circuit as recited in claim 4, wherein the first terminal comprises a positive terminal and the second terminal comprises a negative terminal, the positive terminal being coupled to the first resistor and the second input terminal, and the negative terminal being coupled to both the second resistor and the impedance element.

6. The shunt circuit as recited in claim 5, wherein the first resistor is coupled to both the output terminal and the second resistor.

7. The shunt circuit as recited in claim 6, wherein the impedance element is coupled between the ground and the negative terminal.

8. The shunt circuit as recited in claim 7, wherein the shunt circuit further comprises an input impedance, which has a magnitude that is substantially equal to a magnitude of the impedance element, and which has a sign that is opposite to a sign of the impedance element.

9. The shunt circuit as recited in claim 8, wherein the Riordan-type circuit comprises:
   a first operational amplifier;
   a first resistive element coupled to the first operational amplifier;
   a second resistive element coupled to the first operational amplifier;
   a second operational amplifier;
   a third resistive element coupled to the second operational amplifier; and
   a fourth resistive element coupled to the second operational amplifier.

10. The shunt circuit as recited in claim 9, wherein:
   the first operational amplifier is coupled to the first input terminal, the second input terminal, and the first resistive element;
   the first resistive element is coupled between the first operational amplifier and the second operational amplifier;
   the second resistive element is coupled to the first operational amplifier and the second input terminal;
   the second operational amplifier is coupled to the first resistive element, the third resistive element, and the fourth resistive element;

the third resistive element is coupled to the first input terminal and the fourth resistive element; and the fourth resistive element is coupled to the first resistive element, the third resistive element, and the second operational amplifier.

11. The shunt circuit as recited in claim 10, wherein the Riordan-type circuit further comprises a capacitive element coupled between the first resistive element and the second input terminal.

12. The shunt circuit as recited in claim 11, wherein the first resistive element comprises a variable resistive element.

13. The shunt circuit as recited in claim 1, wherein:

the shunt circuit comprises a piezoelectric shunt circuit for damping broadband structural vibration modes;

an impedance of the negative impedance converter circuit, measured between the first connection terminal and the second connection terminal, comprises a predetermined negative impedance; and an impedance of the piezoelectric shunt circuit, measured between the first input terminal and the second connection terminals comprises the predetermined negative impedance.

14. The shunt circuit as recited in claim 13, wherein the Riordan-type circuit comprises a variable resistor element.

15. The shunt circuit as recited in claim 13, wherein:

the Riordan-type circuit comprises two operational amplifiers and four resistive elements;

a first one of the two operational amplifiers comprises a positive terminal coupled to the first input terminal, a negative terminal coupled to the negative impedance converter circuit, and an output; and a second one of the two operational amplifiers is coupled to the output via one of the four resistors.

16. The shunt circuit as recited in claim 15, wherein the Riordan-type circuit comprises a capacitor coupled between the second input terminal and the output.

17. A Riordan-type circuit, comprising:

a first operational amplifier, comprising a positive terminal, a negative terminal, and an output terminal;

a first resistive element coupled to the output terminal;

a second resistive element comprising a first end coupled to the negative terminal and a second end coupled between the output terminal and said first resistive element;

a second operational amplifier comprising a positive terminal, a negative terminal, and an output terminal;

a third resistive element coupled to the second operational amplifier, between said second operational amplifier positive terminal and said second operational amplifier output terminal;

a fourth resistive element coupled to the second operational amplifier, between said second operational amplifier negative terminal and said second operational amplifier output terminal; and a capacitive element coupled in parallel with the second resistive element.

18. The Riordan-type circuit as recited in claim 17, wherein one of the first resistive element, the second resistive element, the third resistive element, and the fourth resistive element comprises a variable resistive element.

19. The Riordan-type circuit as recited in claim 18, wherein the first resistive element comprises a variable resistive element.

20. A shunt circuit, comprising a negative impedance converter circuit, the negative impedance converter circuit comprising an operational amplifier, a first resistor, a second resistor, and a first impedance element, the operational amplifier comprising a negative terminal, a positive terminal, and an output terminal, the first resistor being coupled between the positive terminal and the output terminal, the second resistor being coupled between the negative terminal and the output terminal, and the first impedance element being coupled between the negative terminal and the ground, wherein the shunt circuit further comprises a second impedance element coupled across the second resistor, and wherein and the positive terminal is coupled to an input load.

21. The shunt circuit as recited in claim 20, wherein the input load comprises a piezoelectric element.

22. The shunt circuit as recited in claim 21, wherein a value of the first resistor is substantially equal to a value of the second resistor.

23. The shunt circuit as recited in claim 22, wherein:

the first impedance element comprises a first capacitor; and the second impedance element comprises a second capacitor, which operates as a stability compensation capacitor.

24. The shunt circuit as recited in claim 23, wherein the shunt circuit has an input impedance, which comprises a magnitude that is substantially equal to a magnitude of the impedance element, and which comprises a sign that is opposite to a sign of impedance element.

25. A shunt circuit, comprising a negative impedance converter circuit, the negative impedance converter circuit comprising an operational amplifier, a first resistor, a second resistor, and a impedance element, the operational amplifier comprising a negative terminal, a positive terminal, and an output terminal, the first resistor being coupled between the positive terminal and the output terminal, the second resistor being coupled between the negative terminal and the output terminal, and the impedance element being coupled between the negative terminal and the ground, wherein the shunt circuit further comprises a third resistor coupled in series with the impedance element between the negative terminal and the ground, and wherein and the positive terminal is coupled to an input load.

26. The shunt circuit as recited in claim 25, wherein the input load comprises a piezoelectric element.

27. The shunt circuit as recited in claim 26, wherein a value of the first resistor is substantially equal to a value of the second resistor.

28. The shunt circuit as recited in claim 27, wherein:

the impedance element comprises a capacitor; and the third resistor operates as a stability compensation resistor.

29. The shunt circuit as recited in claim 28, wherein an impedance of the shunt circuit is equal to a negative value of an impedance of the piezoelectric element.

* * * * *